(12) United States Patent
Yoshida

(10) Patent No.: US 6,879,159 B2
(45) Date of Patent: Apr. 12, 2005

(54) RF COIL AND MAGNETIC RESONANCE IMAGING APPARATUS

(75) Inventor: Masaru Yoshida, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/375,782

(22) Filed: Feb. 26, 2003

(65) Prior Publication Data

US 2003/0164704 A1 Sep. 4, 2003

(30) Foreign Application Priority Data

Mar. 1, 2002 (JP) .......................................... 2002-056088

(51) Int. Cl.⁷ .................................................. G01V 3/00
(52) U.S. Cl. ....................................... 324/318; 324/309
(58) Field of Search ................................ 324/318, 309, 324/319, 307; 600/422

(56) References Cited

U.S. PATENT DOCUMENTS

| | | | |
|---|---|---|---|
| 4,692,705 A | 9/1987 | Hayes | 324/309 |
| 4,820,985 A | 4/1989 | Eash | 324/318 |
| 4,825,162 A | 4/1989 | Roemer et al. | 324/318 |
| 5,208,534 A * | 5/1993 | Okamoto et al. | 324/309 |
| 5,256,972 A * | 10/1993 | Keren et al. | 324/318 |
| 5,363,845 A * | 11/1994 | Chowdhury et al. | 600/422 |
| 5,453,692 A * | 9/1995 | Takahashi et al. | 342/318 |
| 5,559,434 A * | 9/1996 | Takahashi et al. | 324/318 |
| 5,578,925 A * | 11/1996 | Molyneaux et al. | 324/318 |
| 5,757,189 A * | 5/1998 | Molyneaux et al. | 324/318 |
| 6,326,789 B1 | 12/2001 | Yoshida et al. | 324/318 |
| 6,414,485 B1 * | 7/2002 | Kato et al. | 324/307 |
| 6,624,633 B1 * | 9/2003 | Zou et al. | 324/318 |

\* cited by examiner

Primary Examiner—Brij B. Shrivastav
(74) Attorney, Agent, or Firm—Carl B. Horton, Esq.; Armstrong Teasdale LLP

(57) ABSTRACT

For the purpose of changing the geometry of and spacing between loop coils incorporated into an RF coil without moving the RF coil, a first plurality of loops having a geometry optimized for a square sum method employing a phased array, and a second plurality of small loops having a geometry optimized for a sensitivity encoding method are switched by switching elements for an open/close operation using a diode, and at the same time, a first decoupling means and a second decoupling means are switched. Thus, an operator is not required to replace the RF coil positioned on a cradle, and the first plurality of loops for the square sum method employing a phased array and the second plurality of small loops for the sensitivity encoding method can be switched by electronic switching and can be used as RF coils.

20 Claims, 6 Drawing Sheets

RF COIL AND MAGNETIC RESONANCE IMAGING APPARATUS

CROSS REFERENCE TO RELATED APPLICATIONS

This application claims the benefit of Japanese Application No. 2002-056088 filed Mar. 1, 2002.

BACKGROUND OF THE INVENTION

The present invention relates to an RF coil and a magnetic resonance imaging apparatus in which magnetic resonance signals are received by a plurality of coils.

Recent magnetic resonance imaging apparatuses employ an RF (radio frequency) coil to generate an electromagnetic field for producing nuclear magnetic resonance in a subject, and receive signals of the magnetic resonance. There have been proposed methods involving providing a plurality of RF coils, Fourier-transforming magnetic resonance signals from the plurality of RF coils, and combining a resulting plurality of images into a new image.

These methods include a method involving obtaining the square sum of a plurality of images employing a phased array, and a sensitivity encoding method involving acquiring a plurality of wraparound images, and arithmetically separating and combining the wraparound image portions. The square sum method combines a plurality of images obtained by a plurality of RF coils using the square sum. In such image combination, one image having a large imaged region is acquired. The sensitivity encoding method performs imaging by an RF coil on an imaged region smaller than a sensitivity region, and separates and combines a wraparound image generated in an acquired image using a sensitivity profile. In such image combination, the imaging time is reduced, or sped up, because the number of phase encodings is reduced.

In these image combining methods, an operator selects the best possible method considering, for example, the required imaged region, S/N (signal-to-noise) ratio or imaging time, and actual imaging is then conducted.

In such conventional methods, however, the operator has to replace an RF coil every time an image combining method is selected and switched. Specifically, the geometry of or spacing between loop coils incorporated in the RF coil is different in each image combining method, and therefore, the same RF coil cannot be used and the RF coil must be replaced.

Especially, for some imaged sites in a subject, acquisition of image information of precisely the same site is required before and after switching the image combining method. The imaging of the same site is difficult because of body motion due to repositioning of the RF coil, for example. Moreover, the repositioning of the RF coil is troublesome for both the subject and the operator, and also it is a factor of lengthening of the examination time.

By these reasons, how to implement an RF coil and a magnetic resonance imaging apparatus in which the geometry of and spacing between loop coils incorporated in the RF coil can be changed without moving the RF coil, is extremely important.

SUMMARY OF THE INVENTION

Therefore, an object of the present invention is to provide an RF coil and a magnetic resonance imaging apparatus in which the geometry of and spacing between loop coils incorporated in the RF coil can be changed without moving the RF coil.

To solve the aforementioned problems and attain the object, an RF coil, in accordance with the invention of a first aspect, is an RF coil comprising a plurality of loops, characterized in that said loops comprise: a plurality of types of decoupling means for preventing mutual magnetic coupling between adjacent ones of said loops; and switching means for switching between said loops corresponding to said types simultaneously with switching between said types of said decoupling means.

According to the invention of the first aspect, since, in such loops, mutual magnetic coupling between adjacent loops is prevented by a plurality of types of decoupling means, and the loops are switched for each decoupling means simultaneously with switching between the types of the decoupling means by the switching means, a plurality of coils having different loop geometry can be switched without moving them, and they can be operated as RF coils.

An RF coil, in accordance with the invention of a second aspect, is an RF coil comprising a plurality of loops each divided into a plurality of small loops, characterized in that said loops and said small loops comprise: different decoupling means for preventing mutual magnetic coupling between adjacent ones of said loops and between adjacent ones of said small loops; and switching means for switching between said loops and said small loops simultaneously with switching between said different decoupling means.

According to the invention of the second aspect, since, in such loops and small loops, mutual magnetic coupling between adjacent loops and between adjacent small loops is prevented by different decoupling means, and the loops and the small loops are switched simultaneously with switching between the different decoupling means by the switching means, the loops and the small loops can be operated as RF coils even if they are switched.

An RF coil, in accordance with the invention of a third aspect, is characterized in that said decoupling means comprise first decoupling means formed by disposing adjacent pairs of said loops with approximately 10% of the area of said loops overlapped.

According to the invention of the third aspect, since, in the decoupling means, adjacent pairs of the loops are disposed with approximately 10% of the loop area overlapped by the first decoupling means, the coefficient of mutual induction between the loops is reduced to zero, and the plurality of loops can be operated as an RF coil.

An RF coil and a magnetic resonance imaging apparatus, in accordance with the invention of a fourth aspect, is characterized in that each said loop is comprised of a first small loop generally including a portion overlapped by said first decoupling means, and a second small loop formed from a portion excluding said first small loop of said loop.

According to the invention of the fourth aspect, since each loop is comprised of a first small loop generally including a portion overlapped by the first decoupling means, and a second small loop formed from a portion excluding the first small loop of the loop, the loop can be formed by combining small loops.

An RF coil, in accordance with the invention of a fifth aspect, is characterized in that said decoupling means comprise second decoupling means that connects said second small loops using an inductor or a capacitor.

According to the invention of the fifth aspect, since the decoupling means connects the second small loops using an inductor or a capacitor by the second decoupling means, the coefficient of mutual induction between the second small loops is reduced to zero by variation of inductive impedance or capacitive impedance, and the plurality of second small loops can be operated as an RF coil.

An RF coil, in accordance with the invention of a sixth aspect, is characterized in that said switching means comprises a first switching element on a loop line of said first small loop shared by said loop.

According to the invention of the sixth aspect, since the switching means comprises a first switching element on a loop line of the first small loop shared by the loop, the loop and the first small loop can be switched at the same time.

An RF coil, in accordance with the invention of a seventh aspect, is characterized in that said switching means comprises a second switching element on a loop line shared by said first and second small loops.

According to the invention of the seventh aspect, since the switching means comprises a second switching element on a loop line shared by the first and second small loops, the small loops can be switched without affecting the loop.

An RF coil, in accordance with the invention of an eighth aspect, is characterized in that said switching element is an open/close element that operates to open and close said loops and said second small loops.

According to the invention of the eighth aspect, since the switching means operates to open and close the loops and the second small loops by an open/close element, the loops and the second small loops can be switched between an open state and a closed state.

An RF coil, in accordance with the invention of a ninth aspect, is characterized in that said switching means comprises open/close control means that alternately open/close-controls said first and second switching elements to switch between said first and second decoupling means simultaneously with switching between said loops and said second small loops.

According to the invention of the ninth aspect, since the switching means alternately open/close-controls the first and second switching elements to switch between the first and second decoupling means simultaneously with switching between the loops and the second small loops by open/close control means, decoupling between the loops or between the second small loops can be maintained even if the loops and the second small loops are switched, and they can be operated as RF coils.

An RF coil, in accordance with the invention of a tenth aspect, is characterized in that said open/close control means conducts the same open/close control for the plurality of said loops.

According to the invention of the tenth aspect, since the open/close control means conducts the same open/close control for the plurality of the loops, the plurality of loops or the plurality of small loops can be open/close-controlled at the same time.

An RF coil, in accordance with the invention of an eleventh aspect, is characterized in that said open/close element is a parallel resonant circuit incorporating therein a diode.

According to the invention of the eleventh aspect, since the open/close element is a parallel resonant circuit incorporating therein a diode, an open/close operation can be quickly done by an on/off operation of the diode.

An RF coil, in accordance with the invention of a twelfth aspect, is characterized in that said open/close element is a relay.

According to the invention of the twelfth aspect, since the open/close element is a relay, an open/close operation can be done with high impedance in an open state.

An RF coil, in accordance with the invention of a thirteenth aspect, is characterized in that said switching means comprises a third switching element in an end portion of a loop line shared by said first and second small loops.

According to the invention of the thirteenth aspect, since the switching means comprises a third switching element in an end portion of a loop line shared by the first and second small loops, switching between the loops and the second small loops can be achieved by one switching element.

An RF coil, in accordance with the invention of a fourteenth aspect, is characterized in that said third switching element is a selecting element that operates to make a selection.

According to the invention of the fourteenth aspect, since the third switching element is a selecting element that operates to make a selection, a loop line shared by the first and second small loops, and a loop line shared by the loop and the first small loop can be selectively connected.

An RF coil, in accordance with the invention of a fifteenth aspect, is characterized in that said switching means comprises selection control means that selects between said loops and said second small loops by said third switching element.

According to the invention of the fifteenth aspect, since the switching means selects between the loops and the second small loops using the third switching element by the selection control means, the loops and the second small loops can be switched.

An RF coil, in accordance with the invention of a sixteenth aspect, is characterized in that said selection control means conducts the same selection control for the plurality of said loops and for the plurality of said second small loops.

According to the invention of the sixteenth aspect, since the selection control means conducts the same selection control for the plurality of the loops and for the plurality of the second small loops, the plurality of loops or the plurality of second small loops can be selected at the same time.

An RF coil, in accordance with the invention of a seventeenth aspect, is characterized in that said selecting element is a relay.

According to the invention of the seventeenth aspect, since the selecting element is a relay, two loop lines can be selectively connected to one loop line.

An RF coil, in accordance with the invention of an eighteenth aspect, is characterized in that said second small loops have a geometry of and spacing between the second small loops in which the S/N ratio is optimized for conducting a sensitivity encoding method.

According to the invention of the eighteenth aspect, since the second small loops have a geometry of and spacing between the second small loops in which the S/N ratio is optimized for conducting a sensitivity encoding method, an image with good S/N can be acquired by switching the loops to the second small loops in conducting the sensitivity encoding method.

A magnetic resonance imaging apparatus, in accordance with the invention of a nineteenth aspect, comprises: static magnetic field generating means for generating a static magnetic field; gradient magnetic field generating means for generating a gradient magnetic field; an RF coil for transmitting and receiving an RF signal; and control means for controlling said gradient magnetic field generating means and said RF coil, said magnetic resonance imaging apparatus being characterized in that said RF coil having a plurality of loops each divided into a plurality of small loops, comprises: a plurality of decoupling means for preventing mutual magnetic coupling between adjacent ones of said loops and between adjacent ones of said small loops; and switching means for switching between the plurality of said decoupling means simultaneously with switching between said loops and said small loops.

According to the invention of the nineteenth aspect, since the RF coil has a plurality of loops each divided into a plurality of small loops, prevents mutual magnetic coupling between adjacent ones of the loops and between adjacent ones of the small loops by the decoupling means, and switches between the plurality of decoupling means simultaneously with switching between the loops and the small loops by the switching means, an optimized RF coil can be selected corresponding to image combination means and the coil can be operated as an RF coil.

A magnetic resonance imaging apparatus, in accordance with the invention of a twentieth aspect, is characterized in that: said magnetic resonance imaging apparatus further comprises a transmitting section that transmits an RF signal to said static magnetic field and is controlled by said control section; and said RF coil comprises magnetic coupling preventing means for preventing magnetic coupling with said transmitting means.

According to the invention of the twentieth aspect, since the RF coil prevents magnetic coupling with a transmitting coil in the transmitting section by the magnetic coupling preventing means, the RF coil can be operated as a receive-only coil.

As described above, in loops and small loops optimized for different image acquisition methods in accordance with the present invention, mutual magnetic coupling between adjacent ones of loops and between adjacent ones of small loops is prevented by different decoupling means, and the different decoupling means are switched simultaneously with switching between the loops and the small loops by switching means. Thus, there can be obtained the effects that: the loops or small loops can be operated as an RF coil even if they are switched; switching of the RF coil can be electronically achieved without the operator replacing the RF coil on the cradle each time the image acquisition method is changed; and further, image information of precisely the same site in the subject can be acquired using different RF coils with good sensitivity.

Further objects and advantages of the present invention will be apparent from the following description of the preferred embodiments of the invention as illustrated in the accompanying drawings.

DETAILED DESCRIPTION OF THE INVENTION

Preferred embodiments of an RF coil and a magnetic resonance imaging apparatus in accordance with the present invention will now be described with reference to the accompanying drawings.

(Embodiment 1)

Figure 1:
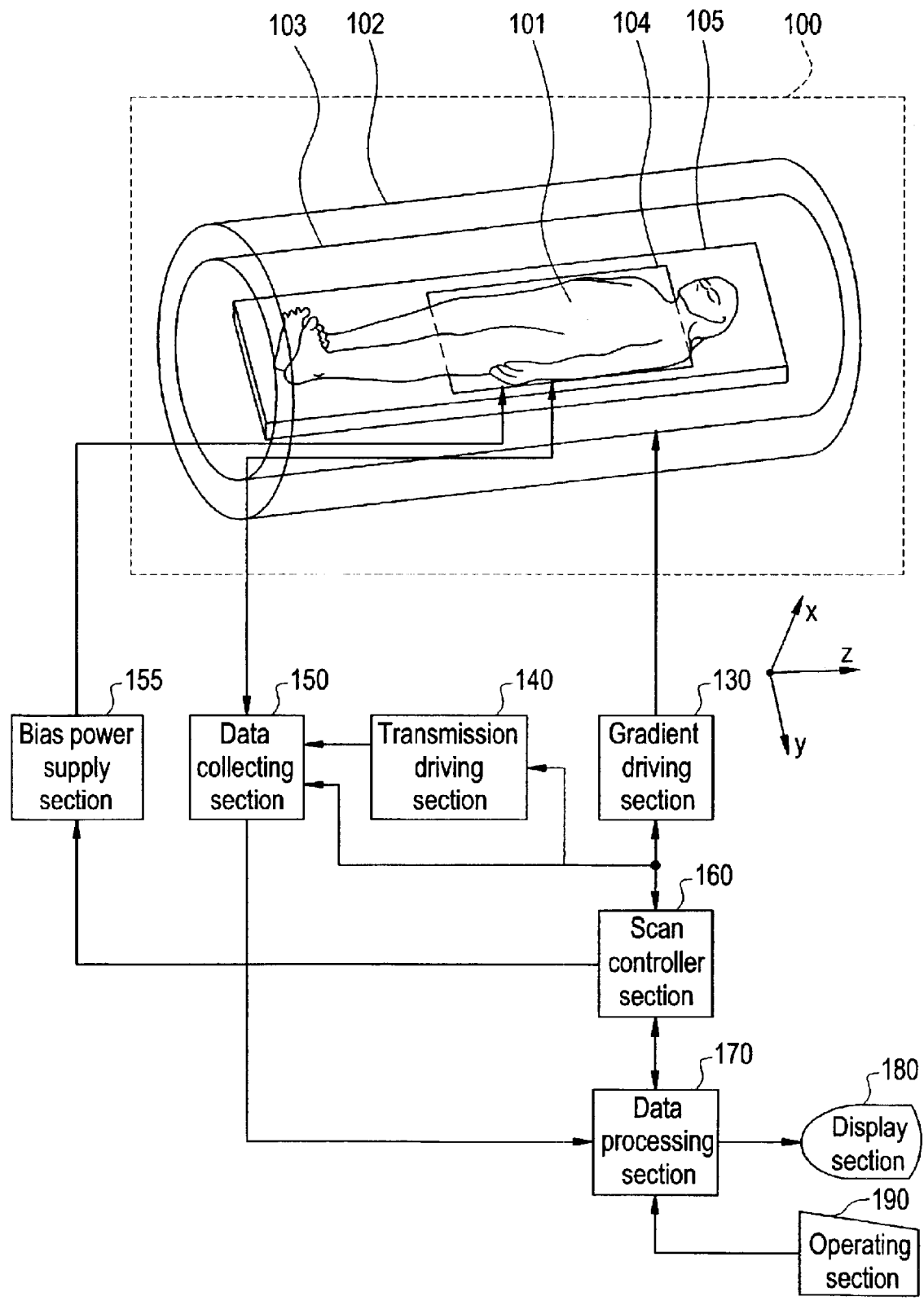
FIG. 1 is a block diagram showing an overall configuration of an RF coil and a magnetic resonance imaging apparatus.

First, an overall configuration of a magnetic. resonance imaging apparatus in accordance with Embodiment 1 will be described. FIG. 1 is a block diagram showing the overall configuration of the magnetic resonance imaging apparatus in accordance with Embodiment 1 of the present invention. In FIG. 1, the magnetic resonance imaging apparatus has a magnet system 100. The magnet system 100 has a main magnetic field coil section 102, a gradient coil section 103, And an RF coil section 104. With the exception of the RF coil section 104, these coil sections have a generally cylindrical shape and are concentrically disposed. A subject to be imaged 101 is rested on a cradle 105 and carried into and out of a generally cylindrical internal space (bore) of the magnet system 100 by carrier means, which is not shown.

The main magnetic field coil section 102 generates a static magnetic field in the internal space of the magnet system 100. The direction of the static magnetic field is generally in parallel with the direction of the body axis of the subject 101. That is, a so-called horizontal magnetic field is generated. The main magnetic field coil section 102 is made using a superconductive coil, for example. The main magnetic field coil section 102 is not limited to the superconductive coil, but may be made using a normal conductive coil or the like.

The gradient coil section 103 generates three gradient magnetic fields for imparting gradients to the static magnetic field strength in directions of three mutually perpendicular axes, or slice, phase and frequency axes.

The RF coil section 104 is placed on the cradle 105, and positioned in the central portion in the magnet system 100 along with the subject 101. The RF coil section 104 generates a high frequency magnetic field for exciting nuclear magnetic resonance within the subject 101 in the static magnetic field space. The RF coil section 104 also receives magnetic resonance signals excited within the subject 101.

The gradient coil section 103 is connected with a gradient driving section 130. The gradient driving section 130 supplies driving signals to the gradient coil section 103 to generate the gradient magnetic fields. The gradient driving section 130 has three driving circuits, which are not shown, corresponding to the three gradient coils in the gradient coil section 103.

The RF coil section 104 is connected with a data collecting section 150, which is also connected with a transmission driving section 140. An RF pulse generated in the transmission driving section 140 is conveyed to the RF coil section 104 via the data collecting section 150, and the RF coil section 104 generates an RF magnetic field in the central portion of the magnet system 100 from the conveyed RF pulse, thereby bringing the subject 101 into a nuclear magnetic resonance excitation state.

Moreover, the data collecting section 150 gathers receive signals received by the RF coil section 104 by sampling them, and collects the signals as digital data.

A bias power supply section 155 has a function of selectively carrying bias current to the RF coil section 104. Thus, a plurality of loop coils contained in the RF coil section 104 can be selectively controlled.

The gradient driving section 130, transmission driving section 140 and data collecting section 150 are connected with a scan controller section 160. The scan controller section 160 controls the gradient driving section 130, transmission driving section 140 and data collecting section 150 to carry out imaging.

The data collecting section 150 is connected to a data processing section 170. Data collected by the data collecting section 150 is input to the data processing section 170. The data processing section 170 is, for example, constituted using a computer. The data processing section 170 has a memory, which is not shown. The memory stores programs for the data processing section 170 and several kinds of data.

The data processing section 170 is connected to the scan controller section 160. The data processing section 170 is above the scan controller section 160 and controls it. The function of the present apparatus is implemented by the data processing section 170 executing programs stored in the memory.

The data processing section 170 stores the data collected by the data collecting section 150 into the memory. A data space is formed in the memory. The data space constitutes a two-dimensional Fourier space. The data processing section 170 performs two-dimensional inverse Fourier transformation on the data in the two-dimensional Fourier space to reconstruct an image of the subject 101.

The data processing section 170 also conducts image combining processing after reconstructing an image. When the square sum combination employing a phased array is conducted, the data processing section 170 calculates the square sum of pixel values of reconstructed images, and produces a new tomographic image having the calculated values as pixel values. When the sensitivity encoding method is conducted, the data processing section 170 arithmetically separates a wraparound image portion from reconstructed images by a plurality of receive coils having different sensitivity distributions, and produces a new tomographic image having a large imaged region.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image and several kinds of information output from the data processing section 170. The operating section 190 is operated by a human operator, and the section 190 inputs several commands, information and so forth to the data processing section 170. The operator interactively operates the present apparatus via the display section 180 and operating section 190.

Figure 2A:
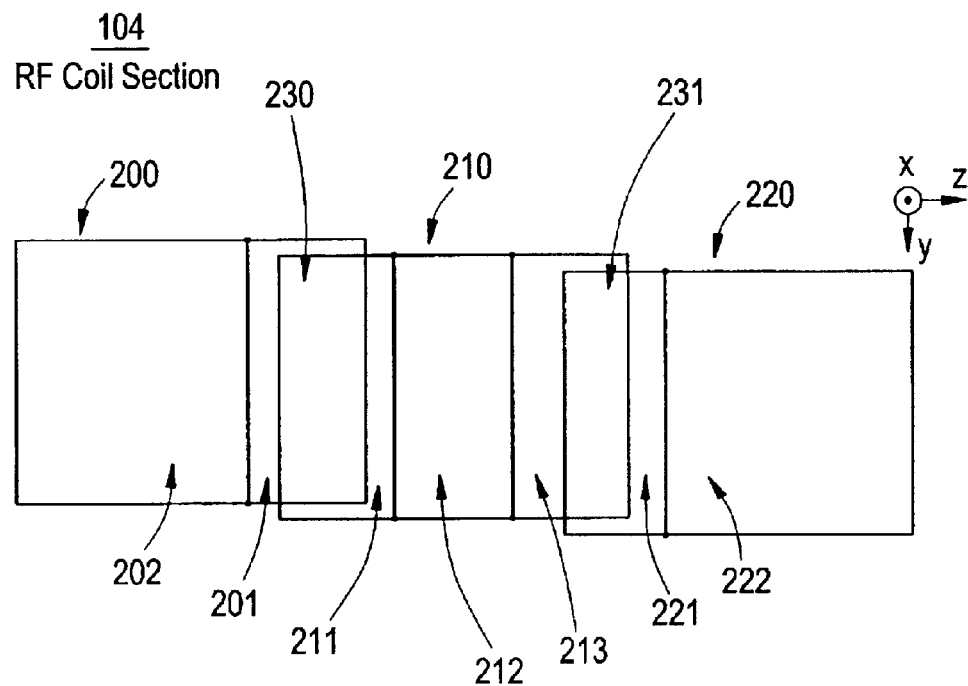
FIG. 2 shows an RF coil section in accordance with Embodiment 1.

A specific configuration of the RF coil section 104 will next be described in detail with reference to FIG. 2. FIG. 2(A) is a schematic diagram in which only loop portions of the RF coil section 104 are extracted for illustration. The RF coil section 104 is comprised of three loops 200–220 partially overlapping one another. Each loop forms an outer periphery of small loops divided into first and second ones. Although the number of loops is three here, it may be four or more. The loop 200 is comprised of a first small loop 201 and a second small loop 202, the loop 210 is comprised of first small loops 211 and 213 and a second small loop 212, and the loop 220 is comprised of a first small loop 221 and a second small loop 222. The loops are made from an electrical conductor, for example, copper foil.

Moreover, the loop 200 and the loop 210 overlap each other in a plane of the first small loop 201 and the first small loop 211 to form first decoupling means 230. The loop 210 and the loop 220 overlap each other in a plane of the first small loop 213 and the first small loop 221 to form first decoupling means 231.

It should be noted that although the loops 200–210 are drawn as being slightly offset from one another in the y-axis direction in FIG. 2(A) and in the drawings thereafter, this is for making the drawings easier to understand and is not for limiting the present invention.

Figure 2B:
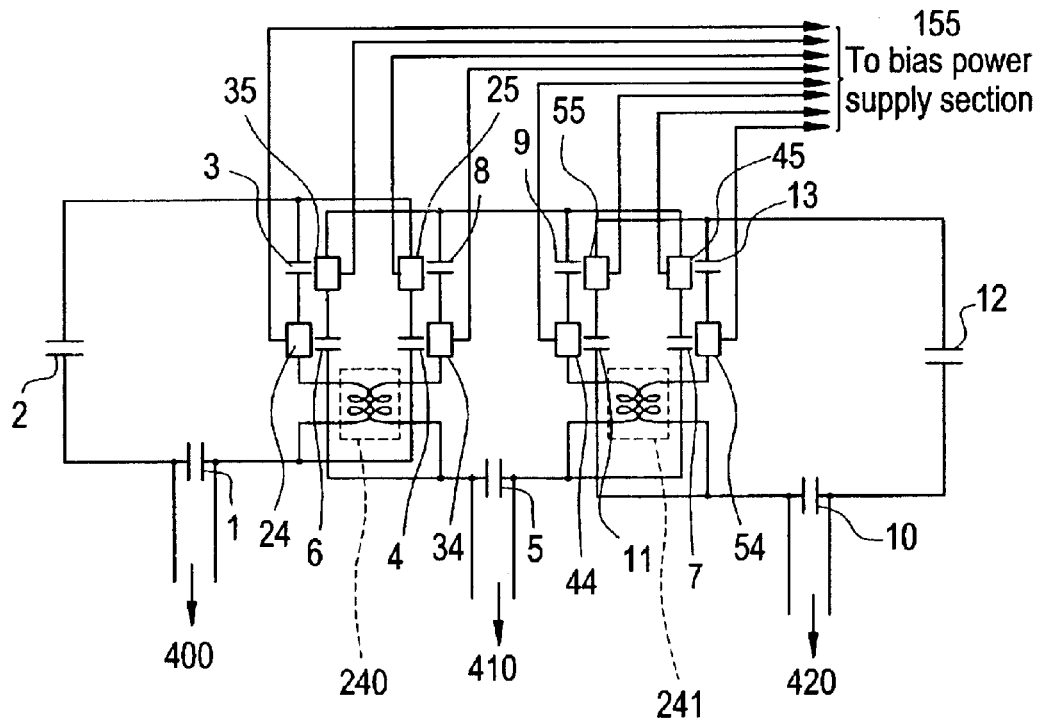

FIG. 2(B) is a circuit diagram including specific electric elements of the RF coil section 104. Switching elements for an open/close operation, capacitors that form a resonant circuit, and inductors that form a decoupling circuit are provided on the loops or small loops.

Switching elements 24 and 25 are provided respectively on a common loop line shared by the small loops 201 and 202, and on a common loop line shared by the loop 200 and the small loop 201. When the switching element 24 is in an open state and the switching element 25 in a closed state, the loop 200 is selected; and when the switching element 24 is in a closed state and the switching element 25 in an open state, the second small loop 202 is selected.

Switching elements 34 and 35, switching elements 44 and 45, and switching elements 54 and 55 are provided in exactly the same way on the first small loops 211, 213 and 221, or on the loops 210 and 220. Thus, switching between the loop 210 and the second small loop 212, and switching between the loop 220 and the second small loop 222 are achieved by the switching elements 34, 35, 44 and 45, and switching elements 54 and 55. Control lines for the switching elements 24–54 and 25–55 are connected to the bias power supply section 155.

Capacitors 1–13 form a resonant circuit along with inductance of the loops or small loops, and the resonant circuit is set to a resonance frequency determined by the static magnetic field strength generated by the main magnetic field coil section 102. Here, the capacity values of the capacitors 1–13 are represented as C1–C13, the inductance of the loops 200–220 are represented as L00–L20, and the inductance of the second small loops 202–222 are represented as L02–L22.

The loop 200 and the second small loop 202 are switched by an open/close operation of the switching elements 24 and 25. Now, for the loop 200 and the second small loop 202 to individually operate as an RF coil, the capacitors 1–4 are determined to satisfy the equation below, and the loop 200 and the second small loop 202 have the same resonance frequency:

$$\left(1 \Big/ \left(\frac{1}{C_1} + \frac{1}{C_2} + \frac{1}{C_3} + \frac{1}{C_S}\right)\right) \times L00 = \quad \text{[Equation 1]}$$

$$\left(1 \Big/ \left(\frac{1}{C_1} + \frac{1}{C_2} + \frac{1}{C_4} + \frac{1}{C_S}\right)\right) \times L02.$$

In the equation, CS represents the capacity value of the switching elements 24–54 and 25–55 in a closed state, and the switching elements 24–54 and 25–55 are assumed to have the same capacity value. Moreover, the resonant frequency is matched with a nuclear magnetic resonance frequency determined by the static magnetic field strength.

Moreover, similarly for the loop 210 and the second small loop 212, and for the loop 220 and the second small loop 222, the capacitors 5–13 are determined to satisfy the equations below:

$$\left(1 \Big/ \left(\frac{1}{C_5} + \frac{1}{C_6} + \frac{1}{C_7} + \frac{2}{C_S}\right)\right) \times L10 = \quad \text{[Equation 2]}$$

$$\left(1 \Big/ \left(\frac{1}{C_5} + \frac{1}{C_8} + \frac{1}{C_9} + \frac{2}{C_S}\right)\right) \times L12,$$

and $$\left(1 \Big/ \left(\frac{1}{C_{10}} + \frac{1}{C_{11}} + \frac{1}{C_{12}} + \frac{1}{C_S}\right)\right) \times L20 = \quad \text{[Equation 3]}$$

$$\left(1 \Big/ \left(\frac{1}{C_{10}} + \frac{1}{C_{12}} + \frac{1}{C_{13}} + \frac{1}{C_S}\right)\right) \times L22.$$

It should be noted that the geometry and arrangement of the loops 200–220 and the second small loops 202–222 are optimized for each different image acquisition method: for example, the geometry and arrangement of the loops 200–220 are set such that an image can be acquired with an imaged range and S/N ratio optimized when using the square sum method employing a phased array (cf. *Magnetic Resonance in Medicine,* 1990; 16: 192–225); and the geometry and arrangement of the second small loops 202–222 are set such that an image can be acquired with an imaged range and S/N ratio optimized when using the sensitivity encoding method (cf. *Magnetic Resonance in Medicine,* 1992; 42: 952–962).

Decoupling means 240 connects a loop line shared by the first and second small loops 201 and 202 with a loop line shared by the first and second small loops 211 and 212 by a transformer. The inductance value of the transformer is determined so that the coefficient of mutual magnetic induction between the second small loops 202 and 212 is reduced to zero. The RF coil section 104 is connected with the data collecting section 150 via the capacitors 1, 5 and 10, and inputting and outputting of the transmit/receive signals to/from the data collecting section 150 are conducted via the capacitors 1, 5 and 10, along with the loops 200–220 and the second small loops 202–222.

Figure 3:
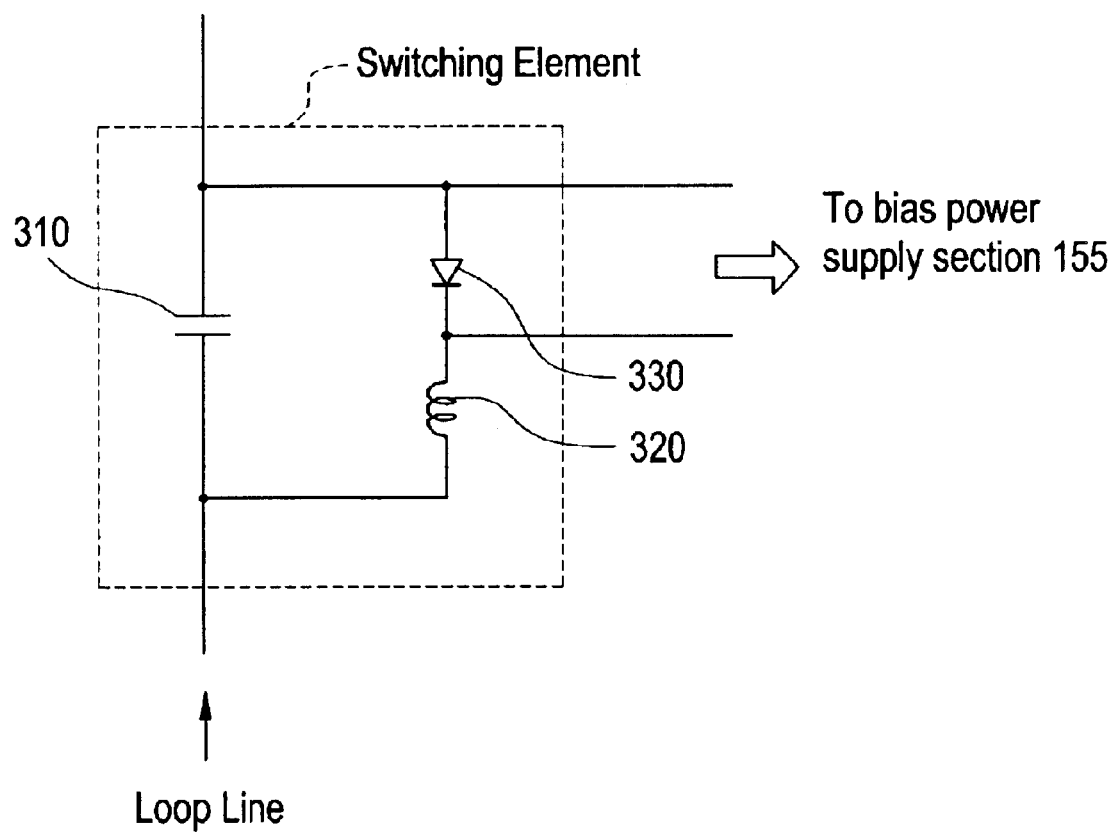
FIG. 3 shows a switching element in accordance with Embodiment 1.

Next, a specific example of the switching element is shown in FIG. 3. FIG. 3 shows an open/close element for opening/closing a loop and a small loop by an on/off operation of a diode 330. A capacitor 310 connected in series to a loop line of a loop or a small loop is connected in parallel with an inductor 320 to form a parallel resonant circuit. The parallel resonant circuit has a resonance point at the nuclear magnetic resonance frequency. When the diode 330 is ON, the impedance is theoretically infinite and the circuit is in an open state; and when the diode 330 is OFF, the impedance is equal to the capacity value of the capacitor 310, and the circuit operates as a capacitor.

Figure 4:
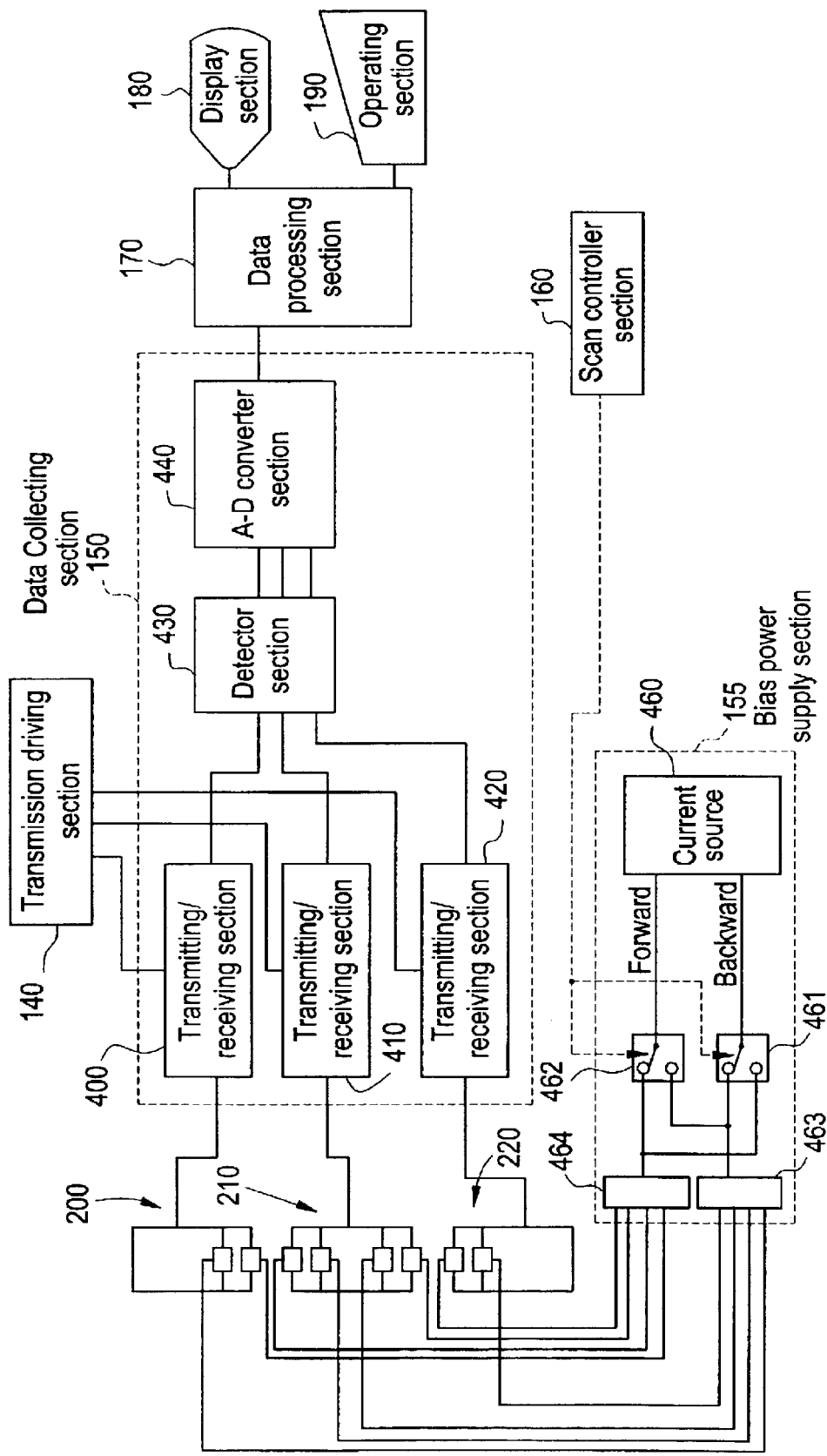
FIG. 4 shows connection among RF coil section, bias power supply section and data processing section in accordance with Embodiment 1.

Next, a configuration of the data collecting section 150 and bias power supply section 155, and connection between the RF coil section 104 and these instruments will be described with reference to FIG. 4. The loops 200–220 are connected to transmitting/receiving sections 400–420 in the data collecting section, and the loops 200–220 transmit an RF signal generated at the transmission driving section 140 to the subject 101, receive an RF signal from the subject 101, and transmit the received signal to the transmitting/receiving sections 400–420. The data collecting section 150 detects the RF signal received by the loops 200–220 at a detector section 430, converts the signal into a digital signal at an A-D converter section 440, and then transfers the digital signal to the data processing section 170.

The bias power supply section 155 is comprised of an electric current source 460, switches 461 and 462, and filters 463 and 464, and control lines for the switching elements 24–54 and 25–55 for the loops 200–220 are connected to the bias power supply section 155. The control lines for the switching elements 24–54 are connected to the filter 463, and the control lines for the switching elements 25–55 are connected to the filter 464. The filters 463 and 464 are low-pass filters for preventing the RF signal from the RF coil section 104 from passing into the bias power supply section 155.

The bias power supply section 155 has two outputs for a forward current and a backward current at the electric current source 460, and switches the switches 461 and 462 in response to instructions from the scan controller section 160 to drive the backward current to the filter 463 when the forward current flows into the filter 464, and drive the forward current to the filter 463 when the backward current flows into the filter 464. Therefore, when the switching elements 24–54 are in an open state owing to the forward current from the filter 463, the switching elements 25–55 are brought to a closed state by the backward current from the filter 464. On the contrary, when the switching elements 24–54 are in a closed state, the switching elements 25–55 are brought to an open state.

In such a condition, when the square sum method employing a phased array is used, a backward current is driven to the filter 464 and a forward current is driven to the filter 463 to bring the loops 200–220 into a closed state. Then, the transmitting/receiving sections 400–420 in the data collecting section 150 conduct transmission/reception to collect a magnetic resonance signal. When the sensitivity encoding method is used, a forward current is driven to the filter 464 and a backward current is driven to the filter 463 to bring the small loops 202–222 into a closed state. Then, the transmitting/receiving sections 400–420 in the data collecting section 150 conduct transmission/reception to collect a magnetic resonance signal.

An operation of the loops 200–220 and a control operation by the bias power supply section 155 will next be described with reference to FIG. 5. The switches 461 and 462 are switched in response to instructions from the scan controller section 160. If a forward current is supplied to the filter 464 by the switching of the switches 461 and 462, the diode 330 in the open/close element shown in FIG. 3 is turned on, and the open/close element operates as a resonant circuit in a high-impedance state. At this time, the filter 463 is supplied with a backward current, and the diode 330 in the switching element shown in FIG. 3 is turned off. Then, the open/close element operates as a capacitor. Thus, the loops 200–220 are brought into a closed state, and the second small loops 202–222 are brought into an open state.

Figure 5A:
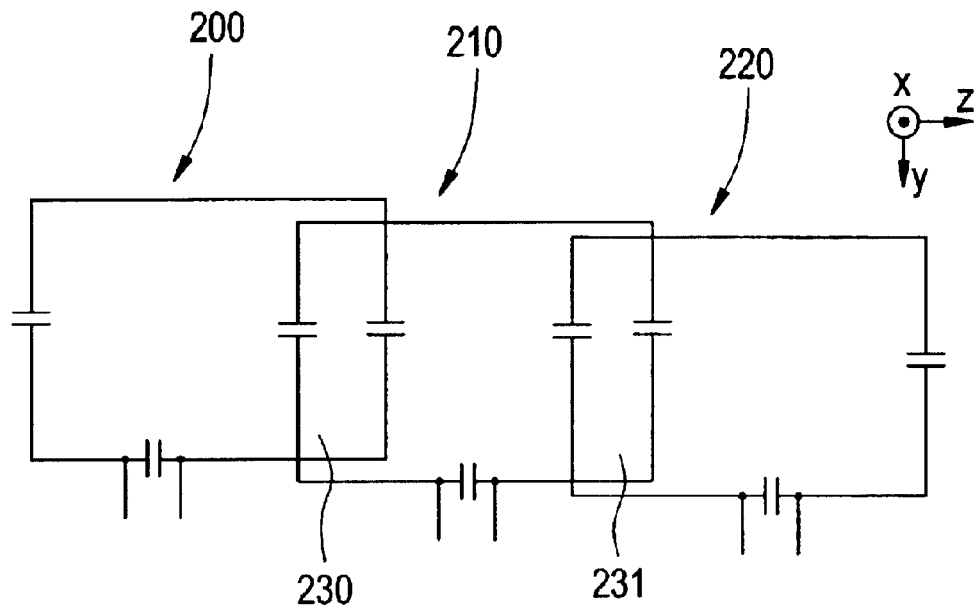
FIG. 5 shows a switching operation of the RF coil section in accordance with Embodiment 1.

FIG. 5(A) shows such a condition. The loops 200–220 form loop coils for the square sum method employing a phased array, and the individual loop coils are decoupled with each other by the first decoupling means 230 and 231 to operate as an RF coil.

On the other hand, when the switches 461 and 462 are switched to supply a backward current to the filter 464, the diode 330 in the open/close element shown in FIG. 3 is turned off. Then, the open/close element operates as a capacitor. At this time, the filter 463 is supplied with a forward current, the diode 330 in the open/close element shown in FIG. 3 is turned on, and then, the open/close element operates as a resonant circuit in a high-impedance state. Thus, the loops 200–220 are brought into an open state, and the second small loops 202–222 are brought into a closed state.

Figure 5B:
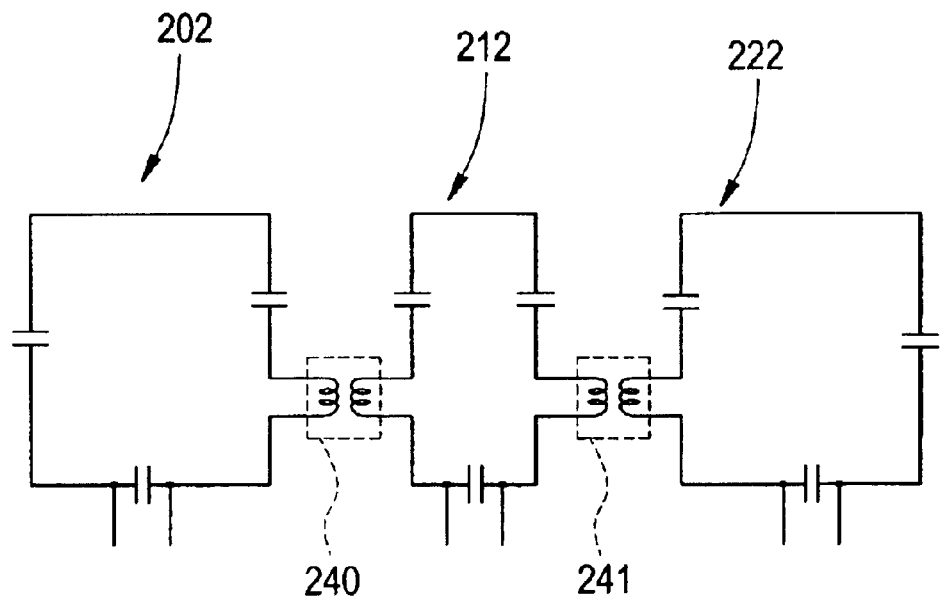

FIG. 5(B) shows such a condition. The second small loops 202–220 form loop coils for the sensitivity encoding method, and the individual loop coils are decoupled with each other by the second decoupling means 240 and 241 to operate as an RF coil.

As described above, in this embodiment, since the loops 200–220 having the geometry optimized for the square sum method employing a phased array, and the second small loops 202–222 having the geometry optimized for the sensitivity encoding method are switched by the switching elements 24–54 and 25–55 for an open/close operation using the diode 330, and at the same time, the first decoupling means 230 and 231 and the second decoupling means 240 and 241 are switched, the operator is not required to replace the RF coil positioned on the cradle 105, and the loops 200–220 for the square sum method employing a phased array and the second small loops for the sensitivity encoding method can be switched only by electronic switching and can be used as RF coils.

While inductors are employed for the second decoupling means 240 and 241 in Embodiment 1, the means may be constructed using capacitors. In this case, magnetic coupling between the second small loops can be canceled by connecting the resonance capacitors provided on different second small loops by a capacitor.

Moreover, while the loops 200–220 are disposed in a plane in Embodiment 1, two sets of the loops 200–220 may be employed to be disposed facing each other positioning therebetween the subject 101. Thus, image information of the central portion of the subject can be acquired with good sensitivity.

Furthermore, while the loops 200–220 are disposed in a plane in Embodiment 1, they may be positioned on a cylindrical surface surrounding the subject 1. Thus, image information of the central portion of the subject can be acquired with good homogeneity.

Furthermore, while the RF coil section 104 is configured to conduct transmission and reception of an RF signal in Embodiment 1, it may be operated as a receive-only coil by providing a transmit coil in the magnet system 100. In this case, a decoupling circuit for preventing magnetic coupling between the transmit coil and RF coil section 104 is provided in the transmit coil and the RF coil section 104.

Furthermore, while the main magnetic field coil section 102 is configured to generate a static magnetic field in a horizontal direction in Embodiment 1, the present invention may be applied to a case in which a magnetic resonance imaging apparatus that generates a static magnetic field in a vertical direction is employed.

Furthermore, while the loops have a rectangular shape in Embodiment 1, the shape is not limited thereto, and a plurality of loops having the shape of saddle, butterfly, solenoid or the like can be provided to similarly function as an RF coil. In addition, such loops may be positioned facing each other positioning therebetween the subject 101, or positioned on a cylindrical surface containing therein the subject 101 in a birdcage configuration.

Embodiment 2

While the switching element that operates to open and close the parallel resonant circuit by the diode is employed in Embodiment 1, a relay may be operated as the switching element. Therefore, the present embodiment shows a case in which a relay is employed as the switching element.

Figure 6:
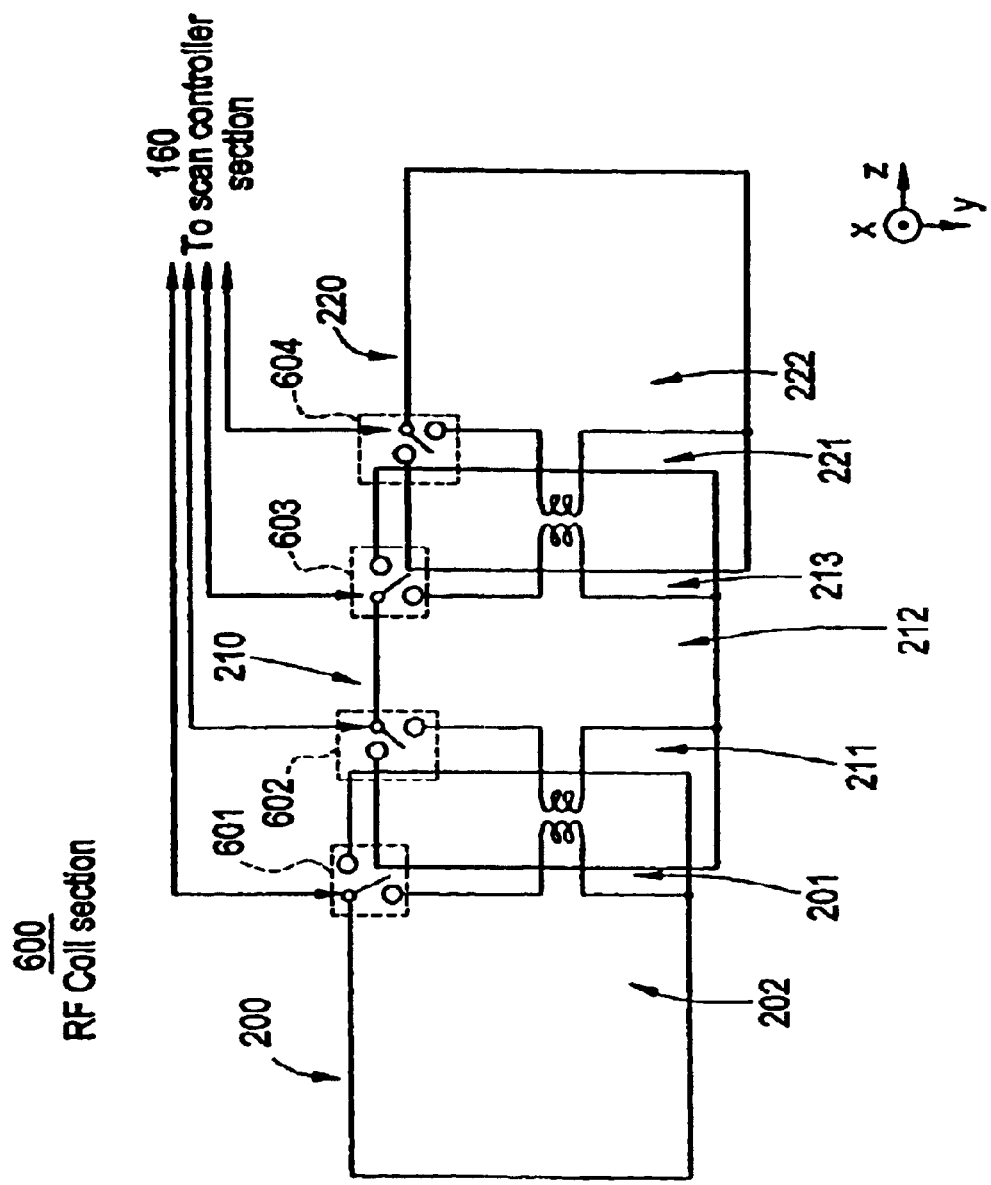
FIG. 6 shows an RF coil section in accordance with Embodiment 2.

FIG. 6 is a circuit diagram showing a particular configuration of an RF coil in accordance with Embodiment 2. The RF coil section 600 corresponds to the RF coil section 104 shown in FIG. 1, and since the remaining configuration is similar to that shown in FIG. 1, detailed description of such configuration will be omitted here.

The RF coil section 600 is comprised of loops 200–220, and the loops 200–220 are comprised of first small loops 201–221 and 213, and second small loops 202–222. A switching element 601 is provided in an end portion of a loop line shared by the first and second small loops 201 and 202. Similarly, switching elements 602–604 are provided in an end portion of a loop line shared by the first and second small loops 211 and 212, in an end portion of a loop line shared by the first and second small loops 213 and 212, and in an end portion of a loop line shared by the first and second small loops 221 and 222. It should be noted that capacitors (not shown) are provided on the loop lines of the loops and small loops in FIG. 6 to form a resonant circuit.

Each switching element 601–604 is comprised of a 2:1 relay, and selection between a loop and a second small loop is achieved by switching between the loop lines. Control signal lines for the switching elements 601–604 are connected to the scan controller section 160, and the switching between the loop lines is conducted in response to instructions from the operator. The relay is preferably constructed using a non-magnetic material for reducing an effect on the static magnetic field generated by the main magnetic field coil section 102.

An operation of the RF coil section 600 will next be described. The switching elements 601–604 conduct selection of a loop line in response to instructions from the scan controller section 160. In the square sum method employing a phased array, the loops 200–220 are selected to form a configuration similar to that shown in FIG. 5(A), and they operate as an RF coil having a coefficient of mutual induction between the loops 200–220 of zero.

In the sensitivity encoding method, the second small loops 202–222 are selected to form a configuration similar to that shown in FIG. 5(B), and they operate as an RF coil having a coefficient of mutual induction between the second small loops 202–222 of zero.

As described above, since relays are employed for the switching elements 601–604 to switch between the loop lines in Embodiment 2, switching between the loops 200–220 having the geometry optimized for the square sum method employing a phased array, and the second small loops 202–222 having the geometry optimized for the sensitivity encoding method is achieved by a smaller number of switching elements; moreover, since the resistance value of the switching elements 601–604 is small in a closed state and that in an open state is substantially infinite, the switching between the small loops can be perfectly achieved and RF signals can be received with high sensitivity.

Many widely different embodiments of the invention may be configured without departing from the spirit and the scope of the present invention. It should be understood that the present invention is not limited to the specific embodiments described in the specification, except as defined in the appended claims.

What is claimed is:

1. An RF coil comprising a set of loops, wherein said loops comprise:

a plurality of decoupling devices for preventing mutual magnetic coupling between adjacent ones of said loops; and a switching device for switching between said set of loops and a set of small loops, wherein each said loop is divided into at least two of said small loops.

2. An RF coil comprising a set of loops, wherein said RF coil comprises:

a first decoupling device for preventing mutual magnetic coupling between adjacent ones of said loops;

a second decoupling device for preventing mutual magnetic coupling between adjacent small loops in a set, wherein said first decoupling device is different than said second decoupling device; and a switching device for switching between said set of loops and said set of small loops simultaneously with switching between said first and second decoupling devices, wherein each said loop is divided into at least two of said small loops.

3. The RF coil of claim 2, wherein said first decoupling device is formed by disposing adjacent pairs of said loops with approximately 10% of the area of said loops overlapped.

4. The RF coil of claim 2, wherein each said loop is comprised of a first small loop generally including a portion overlapped by said first decoupling device, and a second small loop formed from a portion excluding said first small loop of said loop.

5. The RF coil of claim 2, wherein said second decoupling device connects said small loops using an inductor or a capacitor.

6. The RF coil of claim 4, wherein said switching device comprises a first switching element on a loop line of said first small loop shared by said loop.

7. The RF coil of claim 6, wherein said switching device comprises a second switching element on a loop line shared by said first and second small loops.

8. The RF coil of claim 7, wherein said switching device comprises a third switching element in an end portion of a loop line shared by said first and second small loops.

9. The RF coil of claim 8, wherein said third switching element is a selecting element that operates to make a selection.

10. The RF coil claim 9, wherein said selecting element is a relay.

11. The RF coil of claim 2, wherein said switching device comprises a selection control device that selects between said loops and said small loops.

12. The RF coil of claim 2, wherein said selection control device conducts the same selection control for the set of said loops and for said small loops.

13. The RF coil of claim 2, wherein said small loops have a geometry of and spacing between the small loops in which an S/N ratio is optimized for conducting a sensitivity encoding method.

14. The RF coil of claim 2, wherein said switching device is an open/close element that operates to open and close said loops and said small loops.

15. The RF coil of claim 2, wherein said switching device comprises open/close control device that alternately open/close-controls a set of first and second switching elements simultaneously with switching between said loops and said small loops.

16. The RF coil of claim 15, wherein said open/close control device conducts the same open/close control for the set of said loops.

17. The RF coil of claim 14, wherein said open/close element is a parallel resonant circuit incorporating therein a diode.

18. The RF coil of claim 14, wherein said open/close element is a relay.

19. A magnetic resonance imaging apparatus comprising:

a static magnetic field generating device for generating a static magnetic field;

a gradient magnetic field generating device for generating gradients within the static magnetic field;

an RF coil for transmitting and receiving an RF signal; and a control device for controlling said gradient magnetic field generating device and said RF coil, said RF coil having a set of loops and comprising:

a plurality of decoupling devices for preventing mutual magnetic coupling between adjacent ones of said loops and between adjacent small loops in a set; and a switching device for switching between the plurality of said decoupling devices simultaneously with switching between said set of loops and said set of small loops, wherein each said loop is divided into at least two of said small loops.

20. The magnetic resonance imaging apparatus of claim 19, wherein:

said magnetic resonance imaging apparatus further comprises a transmitting section that transmits an RF signal to said static magnetic field and is controlled by said control device; and said RF coil comprises magnetic coupling preventing device for preventing magnetic coupling with said transmitting section.

* * * * *